United States Patent
Fischer et al.

(10) Patent No.: US 9,673,170 B2
(45) Date of Patent: Jun. 6, 2017

(54) BATCH PROCESS FOR CONNECTING CHIPS TO A CARRIER

(71) Applicant: Infineon Technologies AG, Neubiberg (DE)

(72) Inventors: Rupert Fischer, Maxhuette-Haidhof (DE); Peter Strobel, Regensburg (DE); Joachim Mahler, Regensburg (DE); Konrad Roesl, Teublitz (DE); Alexander Heinrich, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/451,868

(22) Filed: Aug. 5, 2014

(65) Prior Publication Data

US 2016/0043054 A1 Feb. 11, 2016

(51) Int. Cl.
*H01L 21/68* (2006.01)
*H01L 23/00* (2006.01)
(Continued)

(52) U.S. Cl.
CPC .......... *H01L 24/97* (2013.01); *H01L 21/6835* (2013.01); *H01L 24/83* (2013.01); *H01L 25/0655* (2013.01); *H01L 25/18* (2013.01); *H01L 25/50* (2013.01); *H01L 23/295* (2013.01); *H01L 23/3121* (2013.01); *H01L 23/3142* (2013.01); *H01L 23/49575* (2013.01); *H01L 2221/68354* (2013.01); *H01L 2221/68363* (2013.01); *H01L 2221/68381* (2013.01); *H01L 2224/04026* (2013.01); *H01L 2224/05611* (2013.01); *H01L 2224/05618* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/06181* (2013.01); *H01L 2224/291* (2013.01); *H01L 2224/2919* (2013.01); *H01L 2224/32225* (2013.01); *H01L 2224/32245* (2013.01); *H01L 2224/40227* (2013.01); *H01L 2224/40247* (2013.01); *H01L 2224/48227* (2013.01); *H01L 2224/48247* (2013.01); *H01L 2224/83005* (2013.01); *H01L 2224/8381* (2013.01); *H01L 2224/8382* (2013.01); *H01L 2224/83191* (2013.01);
(Continued)

(58) Field of Classification Search
CPC ............... H01L 21/6835; H01L 23/295; H01L 23/3121; H01L 23/3142; H01L 23/49575
See application file for complete search history.

(56) References Cited

U.S. PATENT DOCUMENTS

| 4,959,008 A | 9/1990 | Wasulko |
| 7,868,465 B2 | 1/2011 | Otremba et al. |

(Continued)

*Primary Examiner* — Julio J Maldonado
*Assistant Examiner* — Joseph Galvin, III
(74) *Attorney, Agent, or Firm* — Slater Matsil, LLP

(57) ABSTRACT

Methods for connecting chips to a chip carrier are disclosed. In some embodiments the method for connecting a plurality of chips to a chip carrier includes placing first chips on a transfer carrier, placing second chips on the transfer carrier, placing the transfer carrier with the first and second chips on the chip carrier and forming connections between the first chips and the chip carrier and the second chips and the chip carrier.

16 Claims, 5 Drawing Sheets

(51) Int. Cl.
   *H01L 25/00*       (2006.01)
   *H01L 25/065*      (2006.01)
   *H01L 25/18*       (2006.01)
   *H01L 21/683*      (2006.01)
   *H01L 23/495*          (2006.01)
   *H01L 23/29*           (2006.01)
   *H01L 23/31*           (2006.01)

(52) U.S. Cl.
   CPC ........... *H01L 2224/83192* (2013.01); *H01L 2224/83203* (2013.01); *H01L 2224/83851* (2013.01); *H01L 2224/92246* (2013.01); *H01L 2224/92247* (2013.01); *H01L 2224/94* (2013.01); *H01L 2224/95091* (2013.01); *H01L 2224/97* (2013.01); *H01L 2924/10253* (2013.01); *H01L 2924/10329* (2013.01); *H01L 2924/13055* (2013.01); *H01L 2924/14* (2013.01); *H01L 2924/1431* (2013.01); *H01L 2924/1434* (2013.01)

(56) References Cited

U.S. PATENT DOCUMENTS

| | | |
|---|---|---|
| 8,164,199 B2 | 4/2012 | Bhalla et al. |
| 8,178,954 B2 | 5/2012 | Xue et al. |
| 8,247,288 B2 | 8/2012 | Xue et al. |
| 8,482,048 B2 | 7/2013 | Xue et al. |
| 8,648,473 B2 | 2/2014 | Prueckl |
| 8,664,043 B2 | 3/2014 | Ewe et al. |
| 2003/0029556 A1 | 2/2003 | Tsukagoshi et al. |
| 2004/0140122 A1* | 7/2004 | Moll ............... G06K 19/07749 174/260 |
| 2005/0247760 A1 | 11/2005 | Palm |
| 2007/0262118 A1 | 11/2007 | Morita et al. |
| 2009/0051019 A1 | 2/2009 | Huang et al. |
| 2009/0087938 A1 | 4/2009 | Ramappa et al. |
| 2009/0230535 A1* | 9/2009 | Otremba ............... H01L 21/561 257/690 |
| 2010/0072594 A1 | 3/2010 | Kerr et al. |
| 2010/0127386 A1 | 5/2010 | Meyer-Berg |
| 2010/0203676 A1 | 8/2010 | Theuss et al. |
| 2010/0233831 A1* | 9/2010 | Pohl et al. ............. 438/15 |
| 2011/0024884 A1 | 2/2011 | Xue et al. |
| 2011/0024917 A1 | 2/2011 | Bhalla et al. |
| 2011/0059593 A1 | 3/2011 | Xue et al. |
| 2011/0062506 A1 | 3/2011 | Xue et al. |
| 2012/0129315 A1 | 5/2012 | Hu et al. |
| 2012/0193695 A1 | 8/2012 | Xue et al. |
| 2013/0200502 A1 | 8/2013 | Nikitin et al. |
| 2013/0256856 A1 | 10/2013 | Mahler et al. |
| 2013/0277824 A1 | 10/2013 | Mahler et al. |
| 2014/0027892 A1 | 1/2014 | Mahler et al. |
| 2014/0057396 A1 | 2/2014 | Behrens et al. |
| 2015/0115458 A1* | 4/2015 | Palm ............... H01L 24/31 257/774 |

\* cited by examiner

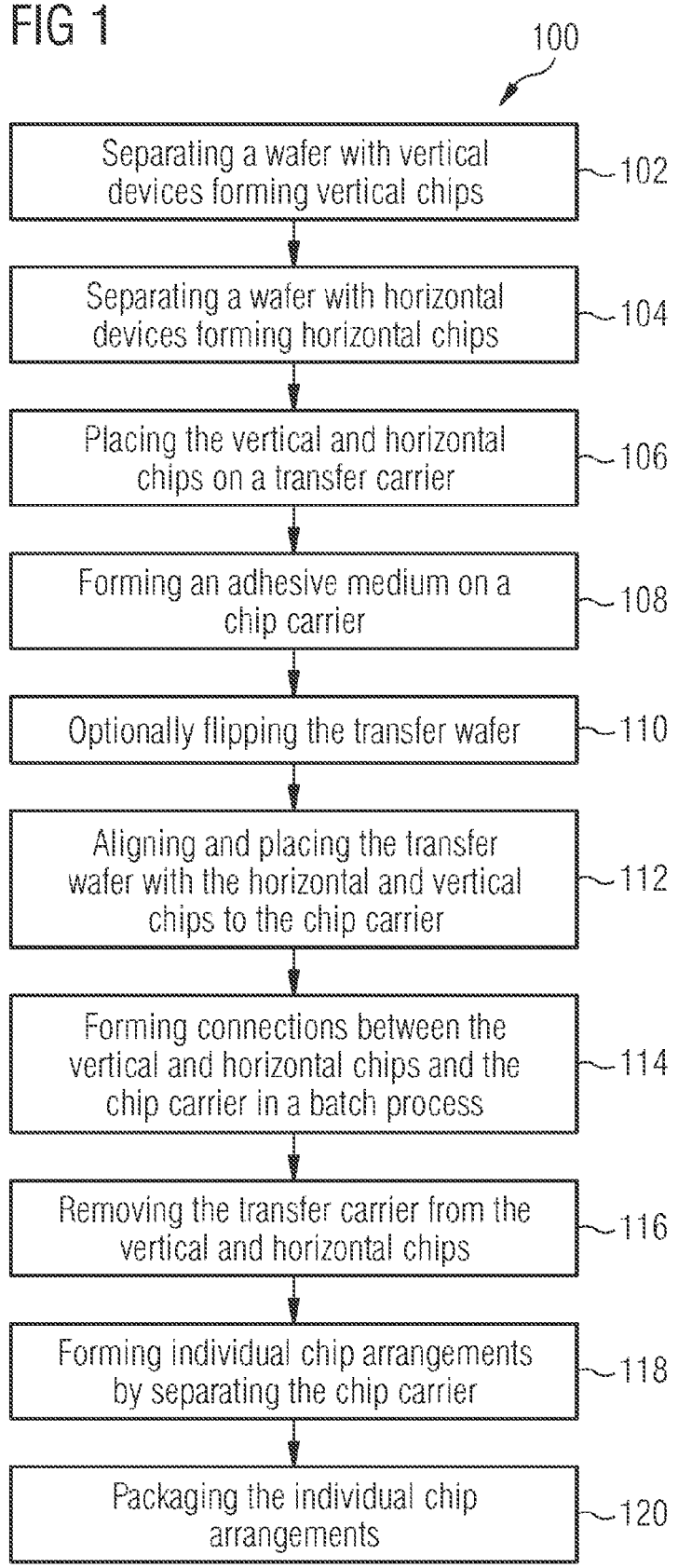

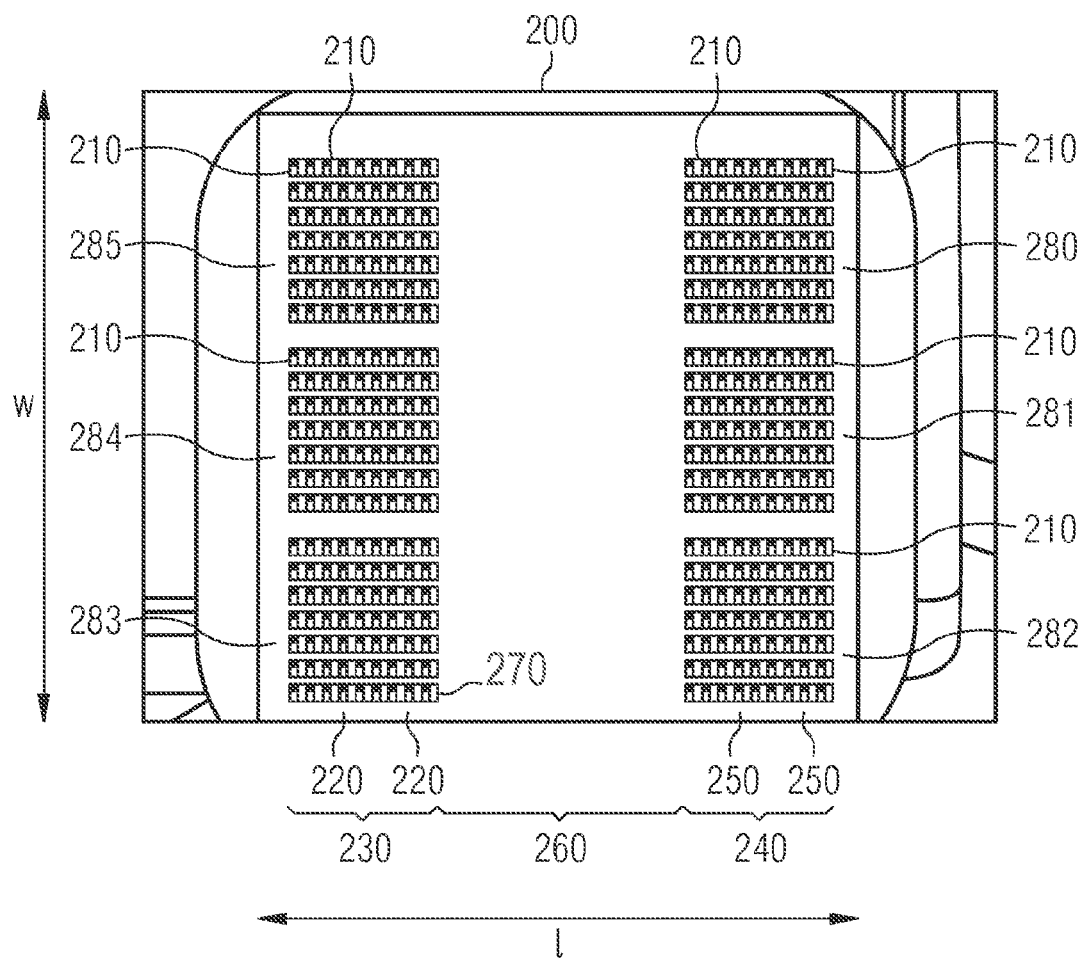

BATCH PROCESS FOR CONNECTING CHIPS TO A CARRIER

TECHNICAL FIELD

The present invention relates generally to a method for connecting a plurality of chips to a chip carrier, and, in particular embodiments, to a batch process for connecting a plurality of chip to a chip carrier.

BACKGROUND

Semiconductor chips are usually connected to chip contact location on a chip carrier (so-called die pad). There are various methods for producing the electrical contacts between the chip carrier and the semiconductor chip.

SUMMARY

In accordance with embodiments of the present invention, a method for placing a plurality of chips on a chip carrier comprises placing first chips on a transfer carrier, placing second chips on the transfer carrier, placing the transfer carrier with the first and second chips on the chip carrier, and forming connections between the first chips and the chip carrier and the second chips and the chip carrier.

In accordance with other embodiments of the present invention, a method for connecting a plurality of chips to a chip carrier comprises placing first chips on a transfer carrier, the first chips comprising chip frontside electrodes and chip backside electrodes, placing second chips on the transfer carrier, the second chips comprising only chip frontside electrodes, placing the transfer carrier with the first and second chips on the chip carrier and forming first connections with a first connection medium between the first chips and the chip carrier and forming second connections with a second connection medium between the second chips and the chip carrier.

In accordance with yet other embodiments of the present invention, a method for connecting a plurality of chips to a chip carrier comprises placing first chips on a transfer carrier, placing second chips on the transfer carrier, placing the transfer carrier with the first and second chips on a chip carrier and applying a pressure and a temperature thereby forming first connections between the first chips and the chip carrier and second connections between the second chips and the chip carrier.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 shows a flowchart of a batch process according to embodiments of the invention;

FIG. 3 shows a top view of a transfer carrier; and

DETAILED DESCRIPTION OF ILLUSTRATIVE EMBODIMENTS

Figure 2A:
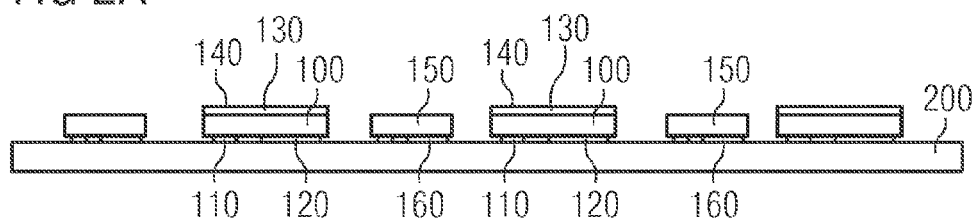
FIG. 2a shows different types of the chips disposed on a transfer carrier.

In conventional multi chip packaging technologies, a driver chip and a power chip are bonded to a leadframe in individual, separate and serial process steps. For example, a power chip is first soldered to the leadframe in a first bonding step and then the driver chip is adhesively connected to the leadframe in a second individual and separate bonding step. The leadframe is warmed up to a temperature on a heating plate and the chips are individually pressed on the leadframe by a pick a place tool. Such individual, separate and serial bonding process steps consume considerable processing time.

Embodiments of the invention provide a method for connecting multiple chips or multiple types of chips to a chip carrier using the same or different connection media in a highly parallel bonding process. Such highly parallel bonding processes have tremendous advantages over conventional chip bonding processes because they reduce overall processing times. Since the chips are connected to a chip carrier in a single process or bonding step less process steps are required compared to the conventional process. Moreover, less temperature steps are necessary which increases the reliability of the manufactured connection.

Embodiments of the invention provide placing a plurality of chips on a chip carrier before the chip carrier or the chips are heated. The chip carrier and the chips may be loaded in to a heating apparatus, pressing apparatus or heating and pressing apparatus (apparatus) together. Alternatively, the chip carrier and the transfer carrier with the chips are loaded in separate steps into the apparatus such as an oven or a press (with or without temperature). After the chip carrier, the transfer carrier and the chips are loaded the physically stable connections between the chips and the chip carrier are formed.

FIG. 1 shows a method 100 for connecting multiple chips to a chip carrier. In step 102 a wafer with vertical devices (e.g., devices configured to provide a vertical current flow) is separated (e.g., cut) on a cutting foil. Separating the wafer forms vertical chips comprising vertical devices. The vertical chips comprise chip front (also called top) side contacts (also called electrodes) and chip back (or bottom) side contacts.

The wafer substrate may include various materials, e.g., semiconductor materials. The wafer substrate may include at least one from the following group of materials, the group of materials consisting of: silicon, germanium, group III to V materials, and polymers. According to some embodiments, the wafer substrate may include doped or undoped semiconductor materials. According to other embodiments, the wafer substrate may include a semiconductor compound material, e.g., silicon carbide (SiC), gallium arsenide (GaAs), indium phosphide (InP), or quaternary semiconductor compound material such as indium gallium arsenide (InGaAs). The wafer substrate may be a silicon-on-insulator (SOI) wafer.

The vertical chips may comprise power semiconductor chips, wherein the power semiconductor chips may include at least one power semiconductor device from the group consisting of: a power transistor, a power MOS transistor, a power bipolar transistor, a power field effect transistor, a power insulated gate bipolar transistor (IGBT), a junction gate bipolar transistor (JFET), a thyristor, a MOS controlled thyristor, a controlled rectifier, a power diode, a power Schottky diode, a silicon carbide diode, and a gallium nitride device. In some embodiment the vertical chip may be a power semiconductor transistor, wherein the power semiconductor transistor is capable of carrying a voltage of up to approximately 600 V. The vertical chip comprises a top side (front side) and bottom side (back side). The vertical chip may include a first chip contact (e.g., gate contact) and a second chip contact (e.g., first source/drain contact) disposed at the top side, and a third chip contact (e.g., second source/drain contact) disposed at the bottom side. Each of the chip contacts may include an electrically conductive contact pad. Each electrically conductive contact pad includes at least one material, element or alloy from the following group of materials, the group consisting of: copper, aluminum, silver, tin, gold, palladium, zinc, and nickel. Each of the contact is electrically isolated from other contacts on the top side of the vertical chip by an electrically insulating material, for example, silicon dioxide, silicon nitride or polyimide or nitride.

In some embodiments an electrically conductive medium is disposed on the bottom side of the vertical chips while they are still part of the wafer. In particular, the electrically conductive medium is disposed on the third chip contact. The electrically conductive medium may be placed on the entire bottom side of the vertical chip or only on a portion of the bottom side of the vertical chip. The electrically conductive medium may include at least one from the following group of materials, the group consisting of: a soft solder, a diffusion solder, an electrically conductive paste such as an electrically conductive nanopaste, and an electrically conductive adhesive. Moreover, the electrically conductive medium may include at least one from the following group of elements, the group of elements consisting of: Ag, Zn, Sn, Pb, Bi, In, Cu, Au, and Pd.

The wafer may be processed on the top side and then turned over or flipped before the electrically conductive connection medium is placed on the wafer. For separation purposes, the wafer may be turned back. Alternatively, the electrically conductive connection medium is placed on the back side of the chips after they became separated.

In step 104, a wafer with horizontal devices (e.g., devices configured to provide a horizontal current flow parallel to a main surface) is separated (e.g., cut) on a cutting foil to form horizontal chips. The horizontal chips comprise chip front (also called top) side contacts but no chip back (or bottom) side contacts.

The wafer substrate material may comprise the same or similar materials as the wafer substrate material described with respect to step 102. The horizontal chips may comprise a semiconductor logic chips such as an integrated circuit chips. The horizontal chip may include at least one semiconductor logic chip from the group of semiconductor logic devices, the group consisting of: an application specific integrated chip (ASIC), a driver chip, a controller chip and a memory chip. Alternatively, the horizontal chip may be an LED chip, an opto-mechanical chip, a sensor chip or a MEMS chip. The semiconductor logic chip may include a low power semiconductor device, e.g., a device capable of handling up to about 5 V, up to about 30 V or up to about 150 V. The horizontal chip may include a chip top side (front side) and a chip bottom side (back side). The chip top side may be the active side where the active areas (e.g., the devices) and all the chip contacts (electrical contacts, contact pads or electrodes) are located and the chip bottom side may be the chip back side where no active areas and no chip contacts are located. The chip front side may be the side which is may comprise metallization layers. The chip back side may comprise a semiconductor material such as silicon and which may be free of a metallization material. The horizontal chip may be electrically insulated on the bottom side when the bottom side is attached to a chip carrier. Each electrically conductive contact pad may include at least one material, element or alloy from the following group of materials, the group consisting of: copper, aluminum, silver, tin, gold, zinc, nickel.

In step 106, the vertical chips are placed on a transfer carrier. The transfer carrier may comprise a transfer foil. The transfer foil may include a polymer such as a silicon elastomer. Is some embodiments, the vertical chips are placed on the transfer carrier so that first and second electrical contacts face the transfer foil and the third electrical contact faces away from the transfer foil. As discussed above the first contact may be a gate contact, the second contact may be a first source/drain contact and the third contact may be a second source/drain contact. In other embodiments the vertical chips are placed on the transfer carrier so that a third contact faces the transfer carrier and the first and second contacts are facing away from the transfer carrier. Other configurations may be possible especially for chips with more than three contacts such as thyristors. The vertical chips may be placed on the transfer carrier by a pick and place tool.

The horizontal chips are placed on the transfer carrier. Is some embodiments, the horizontal chips are placed on the transfer carrier so that the top side with the electrical contacts faces the transfer carrier and the back side faces away from the transfer carrier. In other embodiments the horizontal chips are placed on the transfer carrier so that the top side with the contacts faces away from the transfer carrier and the back side faces the transfer carrier. The horizontal chips may be placed on the transfer carrier by a pick and place tool. It may be the same pick and place tool as the tool which picks and places the vertical chips. Alternatively the pick and place tool may be a different pick and place tool.

The horizontal and vertical chips are placed on the transfer carrier before the transfer carrier and the chips are heated and/or the chips are pressed against the chip carrier. The chips are arranged on the transfer carrier before the chips and the transfer carrier are placed in a heating and/or pressing apparatus such as an oven or press.

An embodiment for placing the chips 100, 150 on the transfer carrier 200 can be seen in FIG. 2a. The vertical chips 100 are placed on the carrier 200 with the top side, including the first contacts 110 (e.g., gate contacts) and the second contacts 120 (e.g., first source/drain contacts), facing the transfer carrier 200, and the horizontal chips 150 are placed on the carrier 200 with the top sides, including the contacts 160, facing the transfer carrier 200. The third contacts 130 of the vertical chips (e.g., second source/drain contacts) and the bottom sides of the horizontal chips face away from the transfer carrier 200. An electrically conductive medium 140 such as a solder material is arranged on the third contacts 130 of the vertical chips 100 while no electrically conductive medium or electrically insulating medium is placed on the bottom sides of the horizontal chips 150.

In some embodiments the vertical and horizontal chips are arranged on the transfer carrier in an array and in an alternating manner. The transfer carrier may comprise columns for horizontal chips and columns for vertical chips. For example, a vertical chip located in a column for vertical chips is placed next to a horizontal chip located in a column for horizontal chips. In other embodiments a column of vertical chips is located next to two columns of horizontal chips or a column of horizontal chips is placed next to two columns of vertical chips. Other configurations are possible so that three or four different chips are located next to each other. The column of horizontal/vertical chips can comprise the same type of horizontal/vertical chips or different types of horizontal/vertical chips.

FIG. 3 shows a top view of a transfer carrier 200. As can be seen from FIG. 3 the transfer carrier 200 comprises rows of placeholders 210 for chips 100, 150. In this particular embodiment, there are 9 columns 220 on a first side 230 of the transfer carrier 200 and 9 columns 250 on a second side 240 of the transfer carrier 200. The first side 230 is spaced apart from the second side 240 by a distance 260. Each column 220, 250 has 21 rows 270. The columns 220, 250 and the rows 270 are subdivided into 6 blocks 280-285. The transfer carrier 200 may have a different configuration for the placeholders 210. For example, there may be 10-20 or more than 20 columns on each side, 25-50 or more than 50 rows and 10-20 or more than 20 blocks. The placeholder may be defined by global alignment marks, by recesses or elevations, for example. Any other suitable placeholder 210 configuration on the transfer carrier 200 can be designed.

The transfer carrier 200 may comprise a length l and a width w. The transfer carrier 200 may comprise a length of 50 cm to 1 meter (alternatively 30 cm to 1.5 m) and a width of 50 cm to 1 m (alternatively 30 cm to 1.5 meter. The transfer carrier may comprise a rectangular shape or scare shape. The transfer carrier 200 can carry more than about 100 chips, more than about 500 chips or more than about 1000 chips.

In the next step (108) an electrically insulating medium (e.g., electrically insulating adhesive) such as an adhesive paste is dispensed on a chip carrier before the horizontal and vertical chips are placed on the chip carrier via the transfer carrier. The adhesive medium may only be located in areas where the horizontal chips will be positioned on the chip carrier (e.g., die attach area for horizontal chips) forming an adhesive film on the chip carrier. The adhesive medium may be dispensed via an ink-jet printing process or via a screen printing process. The dispensable adhesive medium may comprise an epoxy, a glue, or a paste. Alternatively, the adhesive medium such as an adhesive film may be placed on the chip carrier.

In some embodiments the chip carrier may include a metal plate or a metal foil (e.g., a lead frame). The chip carrier may include at least one from the following group of materials, the group of materials consisting of: copper, nickel, iron, copper alloy, nickel alloy, iron alloy. The chip carrier may comprise a thickness of thicker than 50 μm or thicker than 75 μm. The chip carrier may have a thickness ranging from about 200 μm to about 300 μm, e.g., from about 220 μm to about 280 μm, e.g., from 240 μm to about 260 μm. The chip carrier may be a heat sink or a heat dissipater.

In other embodiments, the chip carrier comprises a carrier substrate material such as an insulating material (e.g., ceramic, plastic, etc.) or a semiconductive material. For example, the chip carrier may be a printed circuit board (PCB). In some embodiments the chip carrier is already structured (e.g., split chip carrier) before the transfer carrier and the chips are placed on the chip carrier.

Figure 2B:
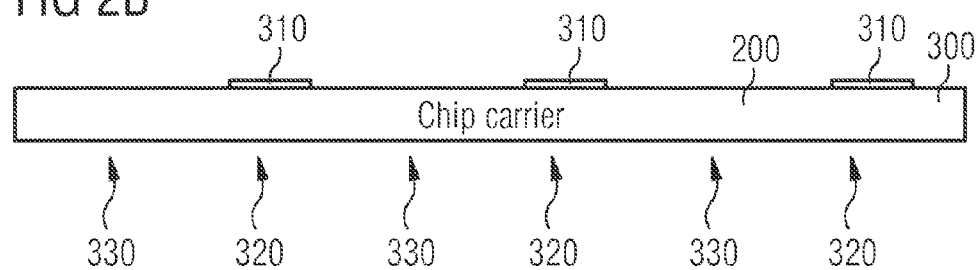
FIG. 2b shows a chip carrier with an adhesive media disposed on certain areas.

FIG. 2b shows an embodiment of step 108 with a chip carrier 300 having the adhesive medium 310 disposed on certain areas. As can be seen from FIG. 2b, the adhesive medium 310 is disposed in die attach areas for horizontal chips 320 but not in die attach areas for the vertical chips 330. In other embodiments the electrically insulting medium may not be disposed on the chip carrier but rather disposed on the bottom side of the horizontal chips. This is discussed with respect to FIG. 4a further below.

Optional step 110 provides that the transfer carrier with the horizontal and vertical chips is flipped or turned over and placed on the chip carrier.

Figure 2C:
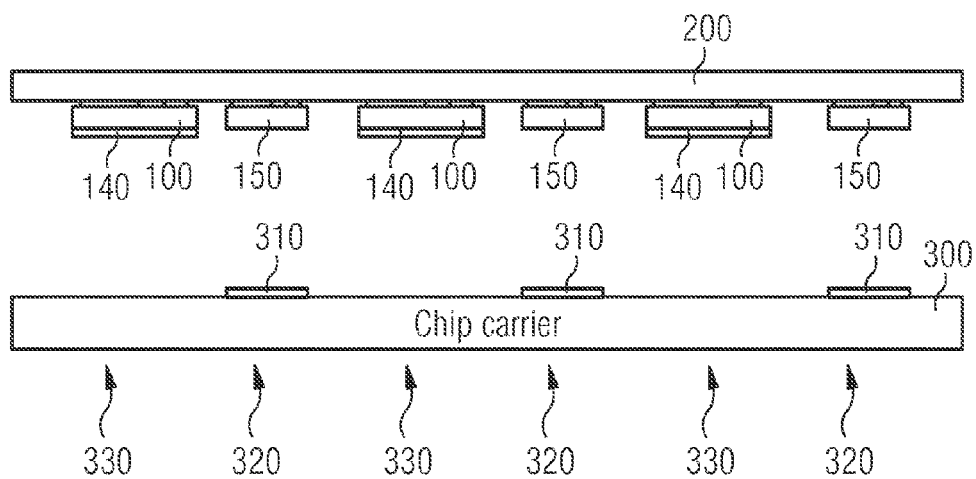
FIG. 2c shows a transfer carrier aligned with a chip carrier.
Figure 2D:
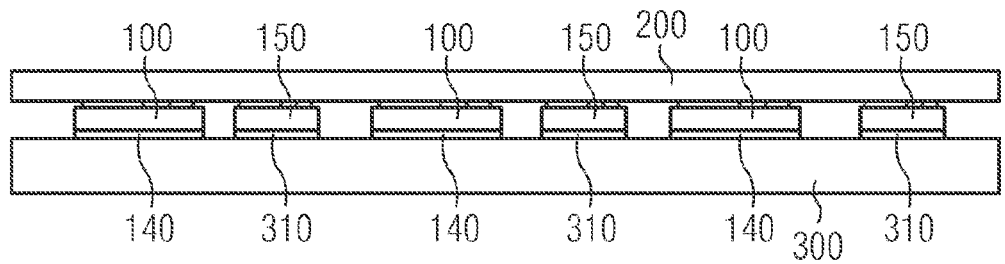
FIG. 2d shows a transfer carrier being placed on the chip carrier.

In step 112 the transfer carrier 200 with the chips thereon and the Chip carrier with the electrically insulating medium disposed in certain areas are aligned to each other so that the vertical chips are located over the die attach area with no electrically insulating medium and the horizontal chips are aligned with the die attach area for horizontal chips and the electrically insulating medium thereon. This can be seen in FIG. 2c. The transfer carrier is then placed on the chip carrier so that the chips are aligned and placed on their respective area. This is shown in FIG. 2d. The thickness of the electrically insulating connection medium 310 may be the same for all horizontal chips 150 and the thickness of the electrically conductive connection medium 140 may be the same for all vertical chips 100. In the some embodiments the thickness of the electrically insulating connection medium 310 and the thickness of the electrically conductive connection medium 140 is the same.

In step 114 connections are formed between the chips and the chip carrier. The transfer carrier, the chips and the chip carrier may be placed into a heating apparatus, pressing apparatus or heated pressing apparatus. Such a heated pressing apparatus may be a press where the chips are heated while pressed against the chip carrier. The press may be a laminate press, In some embodiments the chips are only heated but not pressed in order to form the connections. In other embodiments the chips are only pressed towards the chip carrier but not heated (applying a temperature above the room temperature) in order to form the connections.

When the transfer carrier is pressed to the chip carrier while an elevated temperature is applied (e.g., applying a baking process) connections are formed between the chips and the chip carrier. The connections between the chips and the chip carrier may be formed in a single heating, pressing or heating/pressing step. All the chips on the transfer carrier are heated and/or pressed at the same time.

For example, all the chips on the transfer carrier and the chip carrier are placed into an oven, heat and pressure is applied and the connections are formed while the arrangement is in the oven. In some embodiments, a temperature between about 200C.° and about 400C.° is applied. At the same time a pressure of at least 1 N/mm$^2$ (alternatively, 2 N/mm$^2$ to 10 N/mm$^2$) is applied. Alternatively, a temperature between about 250C.° and about 350C.° is applied. At the same time a pressure of at least 1 N/mm$^2$ (alternatively 2 N/mm$^2$ to 10 N/mm$^2$) is applied.

In some embodiments the temperature in the oven is slowly increased up to about 45 minutes to about an hour. Then the temperature is maintained for about an hour at about 200C.° and about 400C.° or, alternatively, at about 250C.° and about 350C.°. Finally, the temperature is relatively fast reduced to room temperature. For example, the temperature is reduced in less than about 30 minutes while keeping or reducing the pressure.

Figure 2E:
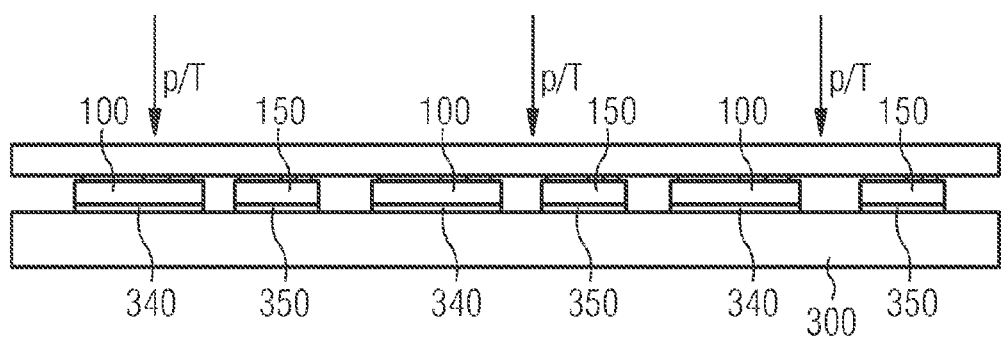
FIG. 2e shows a transfer carrier being pressed on the chip carrier while applying a temperature in a batch process.

While the vertical chips are pressed on the chip carrier and heated the electrically insulating medium (e.g., the adhesive material) forms a strong physical connections between the back sides of the horizontal chips and the chip carrier. In the same process step, the bottom sides of the vertical chips form a strong physical connections with the chip carrier. For example, the adhesive medium (dispensed or placed as a tape) forms a connection between the horizontal chip and the chip carrier at a temperature between about 100C.° and about 200C.° (alternatively between about 150C.° and about 200C.°) and then, at a higher temperature, the electrically conductive medium forms a connection (e.g., solder connection) with the chip carrier or with a bonding pad of the chip carrier between about 200C.° and about 400C.° (alternatively between about 250C.° and about 350C.°). The insulating connection may be an adhesive bond. The conductive connection may be a solder bond with or without forming intermetallic phases. FIG. 2e shows an embodiment of pressing the chips 100, 150 on the chip carrier 300 and annealing the chips 100,150 and the chip carrier 300 thereby forming bonds adhesive bonds 350 and conductive bonds 340.

The thickness of the electrically insulating connection 350 may be the same for all horizontal chips 150 and the thickness of the electrically conductive connection 340 may be the same for all vertical chips 100. In the some embodiments the thickness of the electrically insulating connection 350 and the thickness of the electrically conductive connection 340 is the same.

In some embodiments the transfer carrier and the chip carrier are sequentially loaded in the heating apparatus, pressing apparatus or heated pressing apparatus (referred to as apparatus). For example, the transfer carrier with the chips is first placed or loaded in the apparatus and then, thereafter, the chip carrier is placed or loaded in the apparatus. The apparatus heats the chip carrier and places or presses the transfer carrier on the chip carrier so that connections between the chips and the chip carrier are formed. Alternatively, the apparatus presses the transfer carrier on the chip carrier without applying any heat.

Figure 2F:
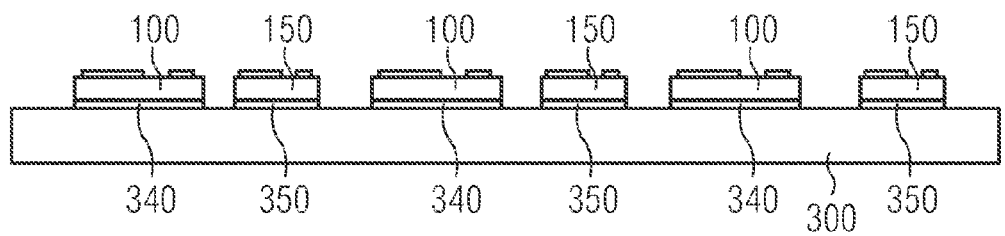
FIG. 2f shows the different types of chips bonded to the chip carrier after the transfer carrier has been removed.

In step 116 the arrangement may be removed from the heating, pressing or heated pressing apparatus and the transfer carrier is removed from the chips so that the chips are now connected to the chip carrier only. For example, the transfer carrier may be removed from the chips by applying ultra violet (UV) light to loosen the connection between the chips and transfer carrier. Then, the transfer carrier is taken off or peeled off. Alternatively, the transfer carrier is removed by an automatic step. FIG. 2f shows the chips 100, 150 bonded 340, 350 to the chip carrier 300. The transfer carrier 200 has been removed from the chips 100, 150.

Figure 2G:
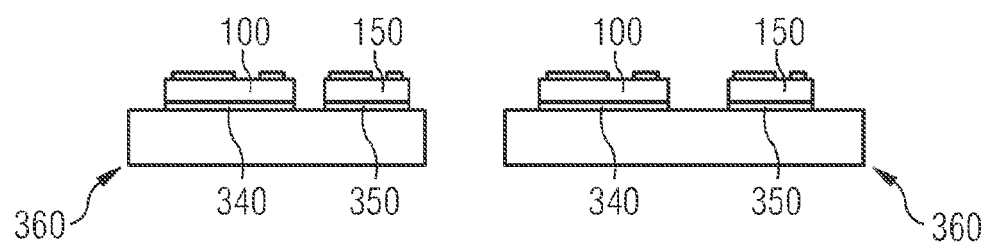
FIG. 2g shows chip arrangements with the different types of chips.

In step 118 the chip carrier is separated into individual chip arrangements. For example, an individual chip arrangement may comprise a portion of the chip carrier, a horizontal chip and a vertical chip. Alternatively, the individual chip arrangement may comprise a portion of the chip carrier and more than two chips. For example, the individual chip arrangement may comprise a vertical chip and more than one (e.g., two) horizontal chips or a horizontal chip and more than one (e.g., two) vertical chips. An embodiment of two individual chip arrangements 360 are shown in FIG. 2g.

The chip arrangements are separated from the other chip arrangements on the chip carrier by cutting, sawing or etching.

In step 120 the individual chip arrangements are laminated, packaged or enclosed in a housing. Before the chip arrangement is packaged (thereby forming a multi-chip package), the chip contacts may be wirebonded or clip bonded. For example, the first and second chip contacts of the vertical chip may be wire bonded to leads of a leadframe and the chip contacts of the horizontal chip may be wire bonded to other leads of the leadframe.

In some embodiments the chips on the chip carrier are wire bonded or clip bonded and then laminated or packaged. Thereafter the laminated chips on the chip carrier are separated in individual laminated chip arrangements (packaged (multi-)chips).

The packaging material may include at least one from the following group of materials, the group consisting of: a filled or unfilled epoxy material, a pre-impregnated composite fiber material, a reinforced fiber material, a laminate material, a mold material, a thermoset material, a thermoplastic material, or a fiber-reinforced laminate material. According to various embodiments, the packaging material may include an unstructured laminate material with or without one or more particle fillers. The particle fillers may comprise silicon dioxide particle fillers, aluminum oxide particle fillers (e.g. glass particles or nano particles), or glass fibers. The packaging material may at least partially surround the chips and (portions of) the chip carrier. The packaging material may insulate the horizontal chip from the vertical chip. The packaging material may be formed over the top sides of the top sides of the chips.

The packaging material may be formed or deposited using one or more deposition processes. Packaging material may be deposited such that the (electrically insulating) packaging material, e.g., unstructured epoxy may at least partially surround the chips. The packaging material formed over the chip carrier may have a thickness ranging from about 5 μm to about 500 μm, e.g., from about 15 μm to about 150 μm. In some embodiments the packaging material may be formed to at least partially surround the chip carrier bottom side. The packaging material formed on the chip carrier bottom side may have a thickness ranging from about 5 μm to about 500 μm, e.g., from about 15 μm to about 150 μm. According to other embodiments, the packaging material may include a first packaging material and a second packaging material.

In some embodiments the surface of the chip carrier may be roughened so that the adherence of the packaging material to the chip carrier is improved.

Figure 4A:
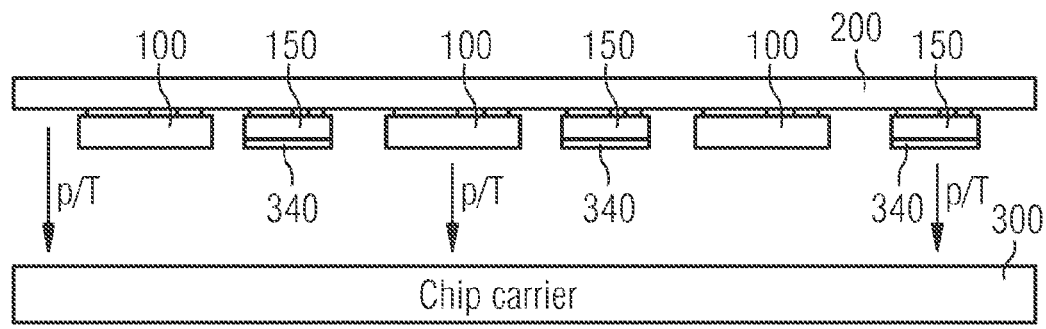
FIGS. 4a-4c show a transfer carrier being pressed on the chip carrier while applying a temperature in a batch process.

FIG. 4a shows a process step of a process which is similar to the process in FIG. 1. In these embodiments, the electrically insulating connection medium (e.g., adhesive) is not disposed on the chip carrier but on the horizontal chips directly. For example, the electrically insulating connection medium is dispensed on the back side of the horizontal chips when the chips are still part of the wafer (e.g., before the chips are separated from the wafer). For example, the electrically insulating connection medium (e.g., paste or tape) is dispensed, applied or placed on the wafer of the horizontal devices before the wafer is separated. According to these embodiments, the horizontal chips are processed as described with respect to step 2. Then the wafer is flipped or turned and the adhesive layer is applied (e.g., adhesive paste is dispensed or the adhesive tape is placed) on the chip carrier. After the adhesive material is disposed on the backside of the wafer, and the wafer is flipped back to its original position, the wafer is separated. The separated horizontal chips may then be placed on the transfer carrier with their active side facing the transfer carrier. Alternatively, the separated horizontal chips may then be placed on the transfer carrier with their active side facing away from the transfer carrier. The transfer carrier with the horizontal and vertical chips is aligned with the chip carrier and then placed or pressed on the chip carrier as shown in FIG. 4a (for example, in the apparatus). In some embodiments, the chip carrier and transfer carrier are aligned and placed upon each other and then placed or loaded into the apparatus for forming the physical connections between the chips and the chip carriers as described with respect to step 112. Embodiments of this process may omit step 108.

Figure 4B:
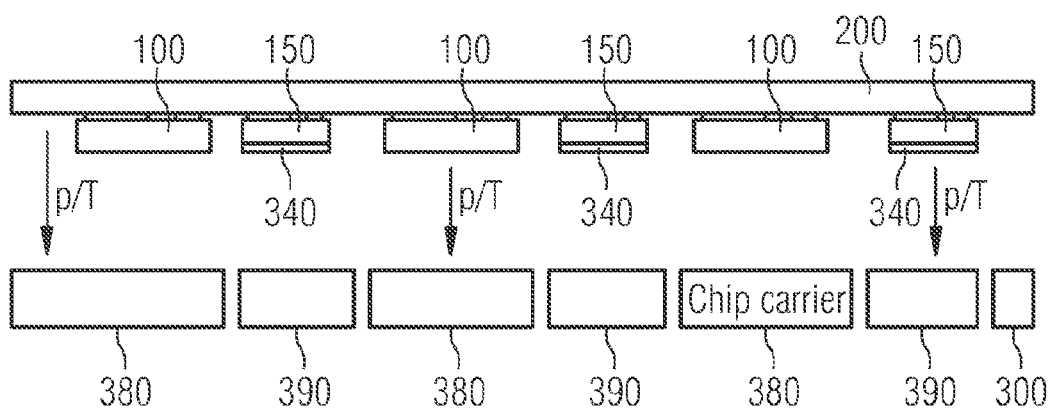

FIG. 4b shows a process step of a process which is similar to the process in FIG. 1. In embodiments of this process, however, the chip carrier is partially or completely structured. If the chip carrier is completely structured (split) separating the chip carrier may not be done as discussed in step 118. If the chip carrier (e.g., metal plate or leadframe) is partially structured (pre-structured) the chip carrier may be completely separated by cutting or etching through the pre-structured area, e.g., through pre-formed recesses. Alternatively, the chip carrier may be split (completely cut) in some areas but not in others. In this case, if the chip carrier is finally separated only certain areas are separated because the other areas are pre-separated.

The split chip carrier may comprise isolated islands 390 and remaining portions 380. For example, the metal plate (e.g., lead frame) 300 comprises die attach areas (isolated islands) 390 which are disconnected from surrounding metal parts of the metal plate 300 after a final separation step (e.g., etching process) of the metal plate or the package, for example. In some embodiments the isolated islands 390 are die attach area for the horizontal chips 150 but not for vertical chips 100. In these cases an electrical conductive connection medium 370 such as a solder or a conductive paste may be applied to the bottom side of the horizontal chips 150. This may have the advantage that the same connection medium may be applied for the different chip types without leading to possible shorts.

In other embodiments, the die attach areas for the horizontal chips are isolated islands and the die attach areas for the vertical chips are (different) isolated islands. In yet other embodiments, the isolated islands comprise two or more chips. For example, each island comprises a horizontal and a vertical chip. After bonding of the chips to their respective islands the chips may be wirebonded and then laminated. It is noted that the transfer carrier and the chip carrier can be aligned and placed on each other outside or inside the apparatus as described with respect to previous embodiments.

Figure 4C:
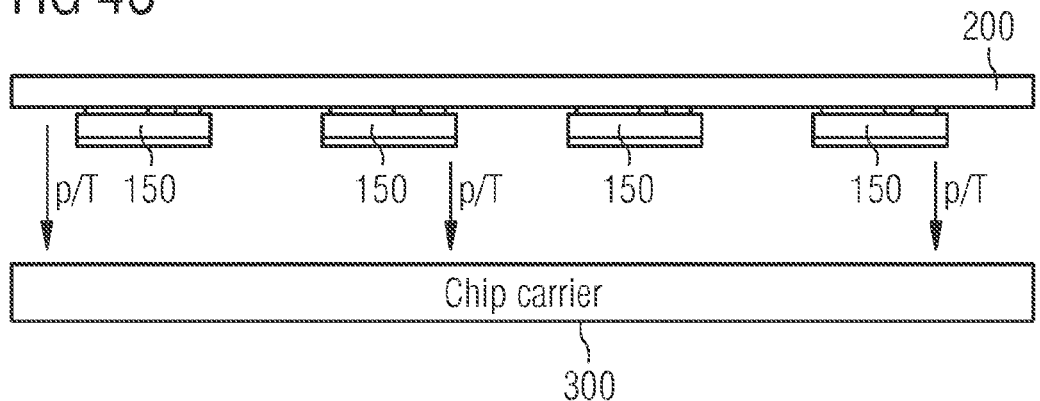

FIG. 4c shows a process step of a process which is similar to the process in FIG. 1. In embodiments of this process only vertical chips 100 are disposed on the transfer carrier 200. No horizontal chips 150 are placed on the transfer carrier 200. All vertical chips 100 are placed on the chip carrier 300 at the same time and form an electrical connection at the same time as described with respect to previous embodiments. Steps 104 and 108 may be omitted.

In some embodiments the vertical chips comprise different types of vertical chips. The different types of vertical chips may also comprise different types of electrically conductive connection media. For example, one vertical chip comprises a backside with a solder material while the other vertical chip comprises a backside with a conductive paste. The different electrically conductive connection media may form a connection between the chips and the chip carrier at different temperatures or at different times but within the same process step (e.g., process step 114).

In other embodiments of this process only horizontal chips are disposed on and bonded to the chip carrier. No vertical chips are placed on the transfer carrier. All horizontal chips are placed on the chip carrier at the same time and form an insulating connection at the same time. Process step 102 may be omitted.

The horizontal chips may comprise different types of horizontal chips such as a logic chips and memory chips. Moreover, the horizontal chips may comprise different semiconductor substrate materials such as chips based on silicon (Si) substrates or GaAs substrates. These different types of horizontal chips (e.g., Si substrate or GaAs substrate) may comprise different types of electrically insulating connection media. For example, the horizontal chip with a silicon substrate may be bonded to the chip carrier with a first adhesive paste and the horizontal chip with the GaAs substrate may be bonded to the chip carrier with a second adhesive paste. The different electrically insulation connection media may form a connection between the chips and the chip carrier at different temperatures or at different times but within the same process step (e.g., process step 114).

For the horizontal chips the insulation connection media may be arranged on the (backside of the) horizontal chips or, alternatively, on the chip carrier. Accordingly, the process of FIG. 1 may be modified to accommodate these embodiments.

In some embodiments the vertical chips are placed on the transfer carrier with the first and second contacts facing away from the chip carrier while the horizontal chips are placed on the transfer carrier with the active side facing away from the transfer carrier. After the transfer carrier is placed on the chip carrier and the chips are bonded to the chip carrier the vertical chips are connected to the chip carrier with the third contact while the active side of the horizontal chip is connected to the chip carrier (with the bottom side of the horizontal chip facing away from the chip carrier). In these embodiments the first and second contacts of the vertical chips may be wire bonded to the chip carrier while the contacts of the horizontal chips may be soldered to the chip carrier. The same solder material may be applied to connect the (backsides of the vertical chips) and the active sides of the horizontal chips to the chip carrier (e.g., PCB).

Embodiments of the invention comprises the formation of bonds between a plurality of horizontal chips with a plurality of electrically insulating connection media and a chip carrier, and between a plurality of vertical chips with a plurality of electrically conductive connection media and the chip carrier in a batch process. In particular, the connections between the different chips and the chip carrier are formed in a single pressure/heating step.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming chip arrangements, the method comprising:
   placing chips on a transfer carrier;
   placing the transfer carrier with the chips directly on a chip carrier;
   after placing the transfer carrier on the chip carrier, forming connections between the chips and the chip carrier; and
   removing the transfer carrier from the chips.

2. The method according to claim 1, wherein forming the connections comprises forming the connections in a single heating step, in a single pressing step, or in a single heating and pressing step.

3. The method according to claim 1, wherein the chips are vertical chips.

4. A method for connecting a plurality of chips to a chip carrier, the method comprising:
   placing first chips on a transfer carrier, the first chips comprising chip frontside contacts on top sides of the chips and chip backside contacts on bottom sides of the chip;
   placing second chips on the transfer carrier, the second chips comprising chip frontside contacts on top sides of the chips and no chip contacts on the bottom sides of the chips;
   placing the transfer carrier with the bottom sides of the first and second chips on the chip carrier; and
   forming first connections with a first connection medium between the bottom sides of the first chips and the chip carrier and forming second connections with a second connection medium between the bottom sides of the second chips and the chip carrier, wherein the first connection medium is an electrically insulating connection medium, and wherein the second connection medium is an electrically conductive connection medium.

5. The method according to claim 4, wherein the electrically conductive connection medium comprises a solder, an electrically conductive paste, or an electrically conductive adhesive, and wherein the electrically insulating connection medium comprises an epoxy, a glue, a paste, a tape or a film.

6. The method according to claim 4, wherein the chip carrier is a metal plate, wherein the metal plate comprises first and second chip islands, wherein the first and second chip islands are isolated from remaining portions of the metal plate, wherein the first connections are formed on the first chip islands, wherein the second connections are formed on the second chip islands, and wherein the first and second connection medium comprises a solder, an electrically conductive paste, or an electrically conductive adhesive.

7. The method according to claim 4, further comprising removing the transfer carrier from the first and second chips after the first and second connections are formed.

8. A method for connecting a plurality of chips to a chip carrier, the method comprising:
   placing first chips on a transfer carrier;
   placing second chips on the transfer carrier, wherein the first chips are different from the second chips;
   placing the transfer carrier with the first and second chips on the chip carrier; and
   applying a pressure and a temperature in a single processing step thereby forming first connections between the first chips and the chip carrier and second connections between the second chips and the chip carrier,
   wherein forming the first connections for the first chips comprises using an electrically insulating connection medium and forming the second connections for the second chips comprises using an electrically conductive connection medium.

9. The method according to claim 8, further comprising removing the transfer carrier from the first and second chips after the first and second connections are formed.

10. The method according to claim 9, further comprising separating the chip carrier thereby forming chip arrangements, each chip arrangement comprising a portion of the chip carrier, a first chip of the first chips and a second chip of the first chips.

11. The method according to claim 10, further comprising packaging the chip arrangements.

12. The method according to claim 8, further comprising forming first connection media on bottom sides of the first chips, and forming second connection media on the bottom sides of the second chips.

13. The method according to claim 8, further comprising forming first connection media at die attach areas of the first chips on the chip carrier, and forming second connection media on bottom sides of the second chips.

14. The method according to claim 8, wherein the transfer carrier is a transfer foil, and wherein the chip carrier is a lead frame or a metal plate.

15. The method according to claim 8, wherein the chip carrier is a lead frame, and wherein the lead frame is a split lead frame comprising insulated die pads.

16. The method according to claim 8, further comprising:
   processing a first wafer with first devices having first electrodes only on single surfaces;
   separating the first wafer thereby forming the first chips comprising the first devices having the first electrodes only on the single surfaces;
   processing a second wafer with second devices having second electrode on opposite surfaces; and
   separating the second wafer thereby forming the second chips comprising the second devices having the second electrodes on the opposite surfaces.

* * * * *